United States Patent [19]
Kim et al.

[11] Patent Number: 5,274,257
[45] Date of Patent: Dec. 28, 1993

[54] FLOATING CHANNEL FIELD EFFECT TRANSISTOR AND A FABRICATING METHOD THEREOF

[75] Inventors: Chang T. Kim, Kyongsangbuk; Young S. Kwon, Seoul, both of Rep. of Korea

[73] Assignee: Samsung Electronics Co., Ltd., Suwon, Rep. of Korea

[21] Appl. No.: 926,715

[22] Filed: Aug. 7, 1992

[30] Foreign Application Priority Data

Feb. 15, 1992 [KR] Rep. of Korea .................. 92-2242

[51] Int. Cl.⁵ .............................................. H01L 29/80
[52] U.S. Cl. ................................... 257/284; 257/192; 257/286; 257/472; 257/619; 257/622
[58] Field of Search ............... 257/192, 284, 286, 472, 257/619, 622

[56] References Cited

U.S. PATENT DOCUMENTS

3,823,352  7/1974  Pruniaux et al. .................. 257/284
4,499,481  2/1985  Greene .............................. 257/194

OTHER PUBLICATIONS

Matsunaga, N. et al. "Half Micron Gate GaAs . . . " in GaAs Ie. Symposium, Tokyo, Japan, 1989, pp. 147–150.
Palevski, A. et al. "Regrown ohmic contacts . . . " in Appl. Phys. Lett. 56(2) N.Y. 1990, pp. 171–173.
Asai, H. et al. "Lateral Growth Process . . . " in J. Electrochem. Soc.: Solid State Science and Technology (1985 Oct.) pp. 2445–2453.

*Primary Examiner*—Edward Wojciechowicz
*Attorney, Agent, or Firm*—Ladas & Parry

[57] ABSTRACT

A field effect transistor is disclosed in which a source region and a drain region are formed to be reverse mesa on a semi-insulating semiconductor substrate with an insulating layer thereon by using a crystal growth characteristic corresponding to the crystal orientation. A channel layer and a gate electrode are formed by self-alignment on the upper part of a void formed according to the reverse mesa of the source and the drain regions, so that the channel layer and the semiconductor substrate are electrically separated by the void. By such a construction, a leakage current and backgating effect are removed, and a fast field effect transistor is attained owing to the reduction of an effective channel length and a gate resistance.

11 Claims, 4 Drawing Sheets

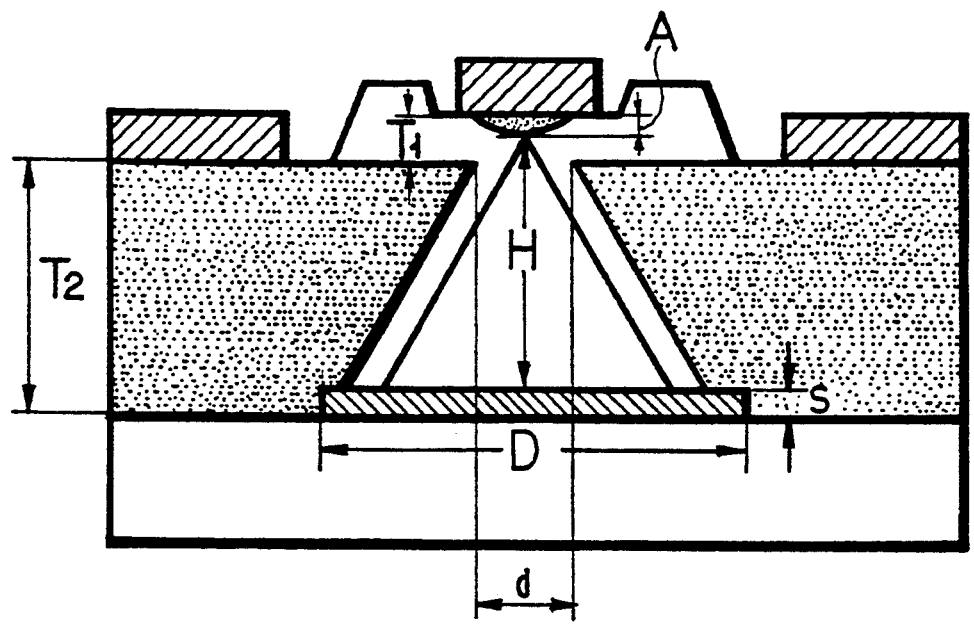
FIG. 2A
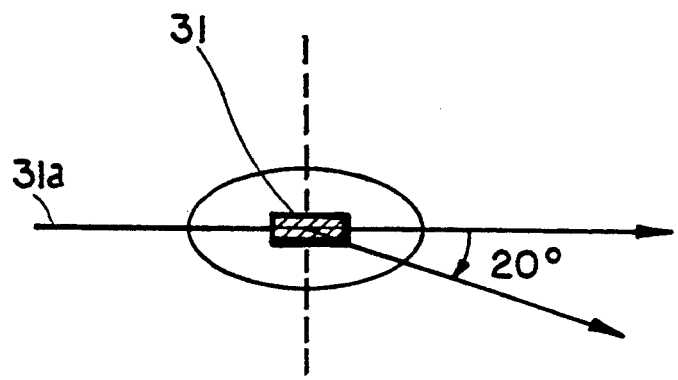
FIG. 3A1

FLOATING CHANNEL FIELD EFFECT TRANSISTOR AND A FABRICATING METHOD THEREOF

BACKGROUND OF THE INVENTION

The present invention relates to a field effect transistor (hereafter refer to "FET"), and more particularly to the field effect transistor and the fabricating method thereof, having a channel over a triangular void formed by using characteristic of crystal growth which an effective channel length can be reduced.

As shown in FIG. 1, a conventional metal silicon field effect transistor (MESFET) is fabricated on semi-insulating substrate 10. A buffer layer 11 which may consist of p-type GaAs material is disposed on the substrate. N-type GaAs channel layer 12 is disposed on the buffer layer 11. Further, n+-type GaAs layer 13 is sequentially formed by a conventional epitaxial growing method.

A source and a drain electrodes 14 are ohmic contacted with the n+-type GaAs layer 13 thereon, and a gate electrode 15 is Schottky contact on the n-type GaAs layer 12 exposed by recess etching on a predetermined portion between the source and the drain electrodes.

In the conventional MESFET, when a voltage is applied to a gate electrode 15, the thickness of a depletion layer of the channel layer 12 is varied depending on the extent of the applied voltage, according to which a current between the source and the drain electrodes 14 flown through the channel layer 12 is controlled.

Such a performance of the MESFET is determined by a transconductance, and a resistance between the source and the drain electrodes. That is, the more the transconductance is and the less the resistance between the source and the drain is, the faster the operational speed becomes.

The transconductance is in inverse proportion to the length of the gate electrode 15. The resistance is reduced according as both the length of the channel and the distance between the source and the drain electrodes are short. Thus, for the purpose of attaining the high-speed performance of MESFET, it is necessary for the channel length to be short and for the resistance between the source and the drain electrodes 14 to be reduced.

Actually, great efforts have been given on the reduction of the gate length which was considered most effective to enhance the capability of the GaAs MESFET, while maintaining its basic structure, in most of the studies.

However, it has accompanied following disadvantages, namely, the gate electrodes 15 fabricated by a conventional photolithography process has a limitation in its length due to the precision in adjustment of mask. Also, there occurs a problem that the excessive reduction of the gate electrode length results in a short channel effect in the sub-micron regime.

On the other hand, in the conventional MESFET, due to a voltage difference generated between the electrode of an adjacent device and the semiconductor substrate, an undesired depletion region is formed between the channel and the substrate, resulting in that the width of the current path becomes narrow. This causes a backgating effect which inevitably changes the threshold voltage and source resistance Rs.

Of course, a buffer layer 11 is formed between the channel layer 12 and the substrate in order to prevent the backgating effect, nonetheless, the backgating effect can not be completely reduced, because of the affects of a voltage of an adjacent device or a leakage current of buffer layer owing to the increase of electric field of the channel layer 12.

It is noted that the buffer layer 11 is used to remove such a leakage current possibly occurring due to the overflow of an electron having a high energy to the substrate 10 by forming a potential barrier against the electrode as well as preventing the backgating effect. Therefore, the impurity concentration needs to be brought down to about $10^{14}$ ions/cm$^3$ in order to make the resistance be intensified.

However, in view of process of fabricating the MESFET, since the buffer layer 11 is to form a plurality of layers within a single chamber, the impurity concentration of the buffer layer 12 is increased by the impurities doped into other layers, so that its resistance could be lowered down.

As a result, there have been many problems in the crystal growth of a qualified buffer layer having a low-concentration impurity and thousands of Å in thickness.

SUMMARY OF THE INVENTION

An object of the present invention is to provide MESFET in which a leakage current can be removed by separating a channel layer and a substrate, while avoiding the dependence on a buffer layer which requires a high-resistance.

Another object of the present invention is to provide a MESFET in which a backgating effect can be removed in an integrated circuit.

Yet another object of the present invention is to provide a MESFET in which an effective channel length and gate resistance can be reduced.

Still another object of the present invention is to provide a MESFET in which a noise figure can be lowered down in a high-frequency performance by reducing a source resistance.

According to the present invention, there is provided a floating channel MESFET comprising a semi-insulating compound semiconductor substrate, an insulating layer formed on the semiconductor substrate with a predetermined angle to substrate and serving as a mask, a first semiconductor layer separately formed on either side of the semiconductor substrate by having a void therebetween of which the upper part is opened with a predetermined distance, a second semiconductor layer formed on both the upper part and inner part of the void, a gate electrode formed on the second semiconductor layer, and a source and a drain electrodes formed on the first semiconductor layer.

There is also provided a method for fabricating a floating channel MESFET, which comprises steps of forming an insulating layer at a predetermined angle on surface of a semi-insulating compound semiconductor substrate, forming a first semiconductor layer on the semiconductor substrate by performing an epitaxy with a selective MOCVD, the first semiconductor layer being separated by a triangular void with the upper part opened over the insulating layer, forming a second semiconductor layer to completely cover the inner and upper parts of the void on the first semiconductor layer, forming a channel layer by etching the other portion than a predetermined portion of the second semiconductor layer on the void in order to thereby expose the first semiconductor layer, forming a source and a drain electrodes on the exposed first semiconductor layer, and forming a gate electrode on the channel layer.

BRIEF DESCRIPTION OF THE DRAWINGS

A better understanding of the present invention may be obtained from the following detailed description of a preferred embodiment, taken in conjunction with the accompanying drawings, in which:

FIG. 2A is a view similar to FIG. 2 but showing various dimensions referred to hereinafter.

FIG. 3A1 shows a plan view of the workpiece shown in FIG. 3A.

DESCRIPTION OF THE PREFERRED EMBODIMENT

Figure 2:
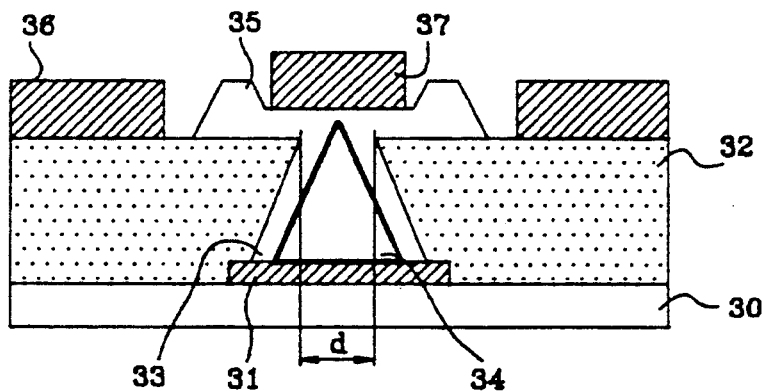
FIG. 2 is a cross-sectional view of a floating channel metal-semiconductor field effect transistor according to the present invention.

FIG. 2 is a cross-sectional view of a floating channel MESFET according to an embodiment of the present invention.

As shown in FIG. 2, the formation of MESFET is that an insulating layer 31 such as $SiO_2$ or $Si_3N_4$ is formed with a stripe pattern on a (001) plane-oriented semi-insulating GaAs substrate 30.

The insulating layer 31, oriented as described hereinafter, has a thickness of $0.4 \sim 1.0$ μm, a width of $1.0 \sim 2.0$ μm and a length of 100 μm.

On the upper part of the GaAs substrate 30 with the insulating layer thereon, n+-type GaAs layer 32 is formed with a thickness of $0.3 \sim 0.8$ μm, the layer 32 has a gap or void therethrough, with the side edges of the layer 32 at the gap being isolated by the insulating layer 31 therebetween. The two sides of the isolated n+-type GaAs layer 32 form a triangular void 33 of which the upper part is opened over the insulating layer 31.

The two portions of n+-type GaAs layer 32 separated by the void 33 form source and drain regions of the MESFET.

A floating channel layer 35, which is crucial for the realization of the object of the present invention, is formed through the upper opened part and the inner part of the void 33.

As a n-type GaAs layer formed by a selective metal organic chemical vapor deposition (MOCVD), the channel layer 35 thus forms another void 34 with its upper part closed within and in the same shape as the void 33.

The whole structure is finally constructed that a gate electrode 37 is formed on the channel layer 35 by Schottky contact, and the source and the drain electrodes 36, having the electrode 37 therebetween, is formed on the source and the drain regions of n+-type GaAs layer 32 by ohmic contact.

In such a MESFET structure, it is observed that the void 34 intentionally formed in the formation of the n+-type GaAs layer 32, acting as the source and the drain regions below the channel layer 35, completely separates the channel layer 35 and the semiconductor substrate electrically.

Accordingly, an undesired depletion layer between the channel layer 35 and substrate 30 is prevented from being formed, so that a backgating effect hardly occurs. Moreover, a leakage current is also removed, so that the current through the channel layer 35 can not be overflown to the substrate 30.

Furthermore, when the threshold voltage is applied, a depletion region (FIG. 2A) is formed within the channel layer 35 below the gate electrode which determines the effective channel length.

Thus, regardless of the length of gate electrode 36, the effective channel length can be less than the distance d (FIG. 2) between the facing edges of the layer 32 forming the source and drain regions. Also, source resistance Rs is reduced.

Such a MESFET of the above embodiment may be more apparent by the fabricating method described hereafter in accompanying FIG. 3A to 3E.

A semi-insulating GaAs substrate 30 of crystal plate (001) is employed as a starting material. The substrate 30 is etched with an etchant of 5:1:1 $H_2SO_4:H_2O_2:H_2O$ for three minutes at the temperature of 30° C., and is rinsed for five minutes in a deionized water.

Figure 1:
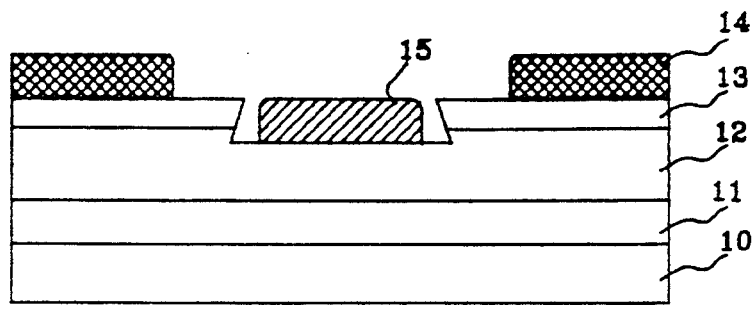
FIG. 1 is a cross-sectional view of a conventional metal-semiconductor field effect transistor.
Figure 3A:
FIG. 3A to 3E show sequential fabricating processes of the floating channel metal-semiconductor field effect transistor of FIG. 2.

First, as shown in FIG. 3A, $SiO_2$ layer 31 is deposited on the GaAs substrate 30 with a thickness of $500 \sim 1,000$Å. The $SiO_2$ layer 31 has an axis 31a (FIG. 3A1) of elongation which forms an ANGLE of about $20° \sim 30°$ with the $<\bar{1}10>$ orientation representing a main plane of the GaAs substrate. In this respect, a thermally stable $Si_3N_4$ may be used instead of the $SiO_2$. The angular off-set between the stripe 31 and the $<\bar{1}10>$ orientation is found to be optimal for obtaining the reverse sloped edges of the layer 32.

The $SiO_2$ layer has approximately $0.04 \sim 0.1$ μm in thickness, $1 \sim 2$ μm in width and 100 μm in length, and the width determines the height of a void to be formed in the later process.

Figure 3B:
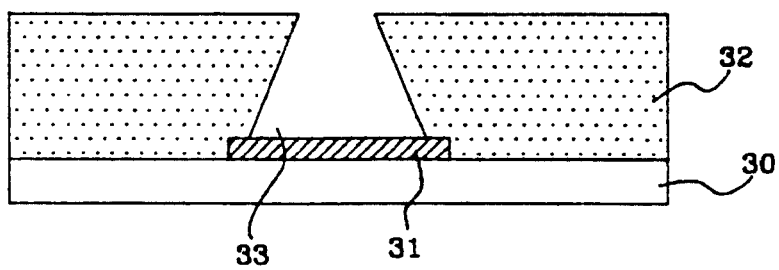

Thereafter, as shown in FIG. 3B, by using the $SiO_2$ layer 31 as a mask, n+-type GaAs layer 32, on which impurities such as Si and Te are doped with about $2 \times 10^{18} \sim 4 \times 10^{18}$ ion/cm$^3$, grows crystal selectively on the upper part of the GaAs substrate 30 by MOCVD method.

As this time, the condition for growing the n+-type GaAs layer 32 is that the mole fractions of trimethylgallium (TMG) and $AsH_3$ are $3.7 \times 10^{-3}$ and $1.5 \times 10^{-3}$ respectively, and growth temperature is 650° C. In this case, growing temperature and $AsH_3$ mole fraction are critical parameters for forming a reverse mesa void.

In the crystal growth of the n+-type GaAs layer 32 according to the selective MOCVD method, the GaAs crystal growth is vertically and horizontally made simultaneously on the substrate except the portion where the $SiO_2$ layer 31 is formed, thereby forming a reverse mesa type of reverse slope with its upper part opened.

The n+-type GaAs layer 32 has a thickness of $0.3 \sim 0.8$ μm, and the opened space d of the reverse mesa void 33 is approximately $0.5 \sim 1.5$ μm. The thickness of n+-type GaAs layer 32 determines the distance of the opened space d of the void. Therefore, by adjusting the thickness properly, the length of the effective channel is liable to be considerably shortened.

Figure 3C:
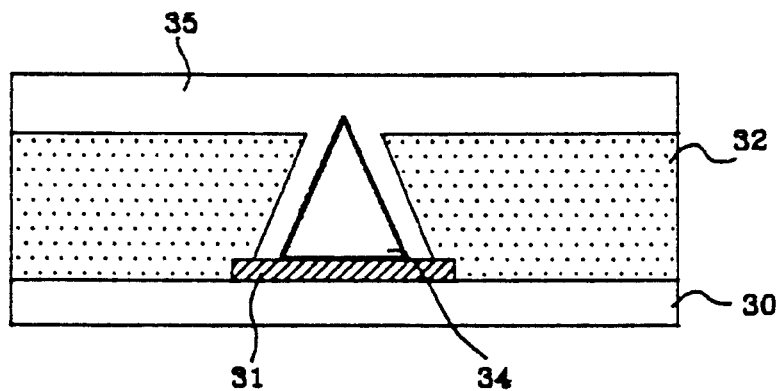
Figure 3D:
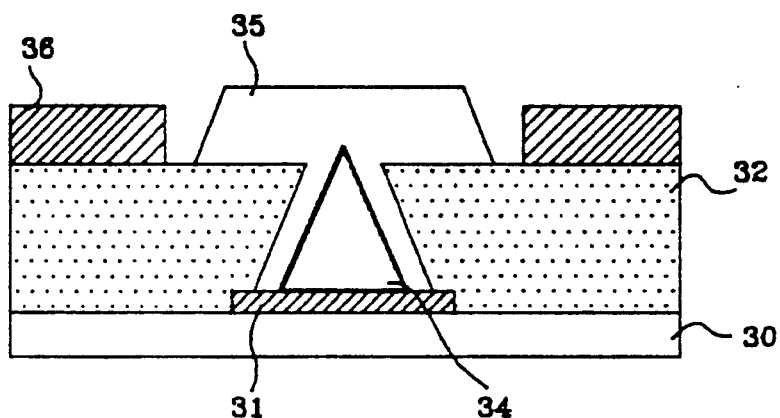
Figure 3E:
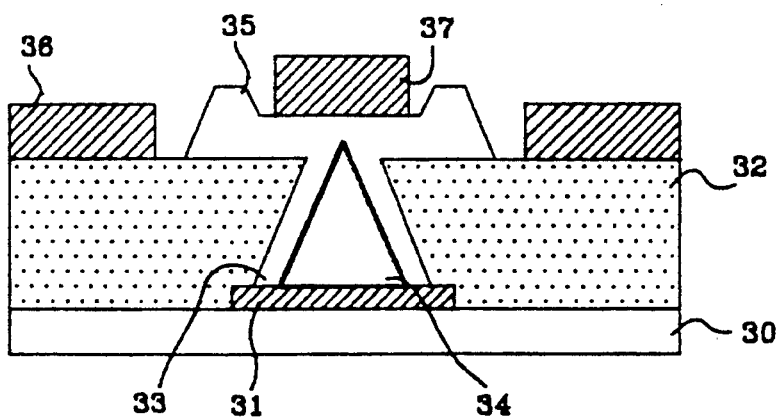

Consecutively, as shown in FIG. 3C, n-type GaAs layer acting as channel layer on which impurities such as Si or Te are doped with about $4 \times 10^{17}$ cm$^{-3}$, is formed by either MBE or MOCVD method.

In the course of formation of the channel layer 35, it grows on the reverse sloped side edges of the layer 32 which define the void 33 and grows on the upper surface of the layer 32. The channel layer of n-type GaAs layer 35 formed on the side edges of the layer 32 is thinner than on the upper surface thereof because the former grows more slowly than the latter. The grown channel layer 35 forms a triangular void 34 at its lower part.

Because the thickness of the channel layer 35 is determined by the distance from the apex of the triangular void 34 to the surface of the channel layer, a threshold voltage of a desired device is easily adjusted by the thicknesses of the n GaAs layer 35 and the n+ GaAs layer 32. That is, assuming that the thickness of the n layer 35 is $T_1$, it is formulated as $$T_1 = A + H + S - T_2 \quad (1)$$

where A (FIG. 2A) is the active channel depth for desired threshold voltage, H is the void height, S is SiO$_2$ thickness, and $T_2$ is the n+-type GaAs layer 32 thickness. The void height H can be experimentally determined as follows $$H = \beta \times D \tan \psi \quad (2)$$

where D is the SiO$_2$ width, $\beta$ is the lateral growth parameter of about 0.32, and $\psi$ is the void angle from the substrate of about 50°.

Table I represents geometry parameters of the fabricated device obtained from SEM observation.

TABLE I

| parameter | symbol | value |
| --- | --- | --- |
| channel depth | A | 0.26 μm |
| n-layer thickness | $T_1$ | 0.41 μm |
| n+-layer thickness | $T_2$ | 0.41 μm |
| SiO$_2$ thickness | S | 0.05 μm |
| SiO$_2$ width | D | 1.8 μm |
| void height | H | 0.69 μm |

Consequently, the n+-type GaAs layer 32 is exposed by etching the n-type GaAs layer of channel layer 35 over the upper part of the triangular void 34. The source and the drain electrodes 36 are then formed on the exposed portion of the n+-type GaAs layer 32 by using AuGe/Ni/Au as the ohmic metal, and alloyed at 370° C. for 90 seconds using a rapid thermal annealing (RTA) system.

After shallow recess etching the n-type GaAs layer 35 on the triangular void 34, a gate electrode 37 is formed with Ti/Pt/Au, Pt or Al by a conventional lift-off process.

Figure 4:
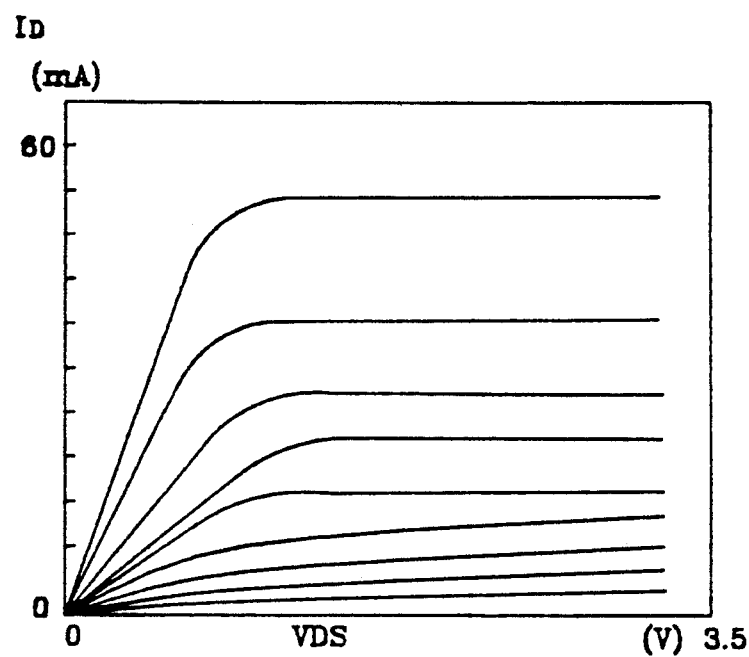
FIG. 4 is a diagram showing an output characteristics of the floating channel metal-semiconductor field effect transistor according to the present invention.

FIG. 4 shows the typical output characteristics of floating channel metal semiconductor field effect transistor according to the present invention where gate length × width is 2 μm × 100 μm.

At Vg=0 and Vd=2v, an output conductance, go, of 22 mS/mm is obtained.

Figure 5:
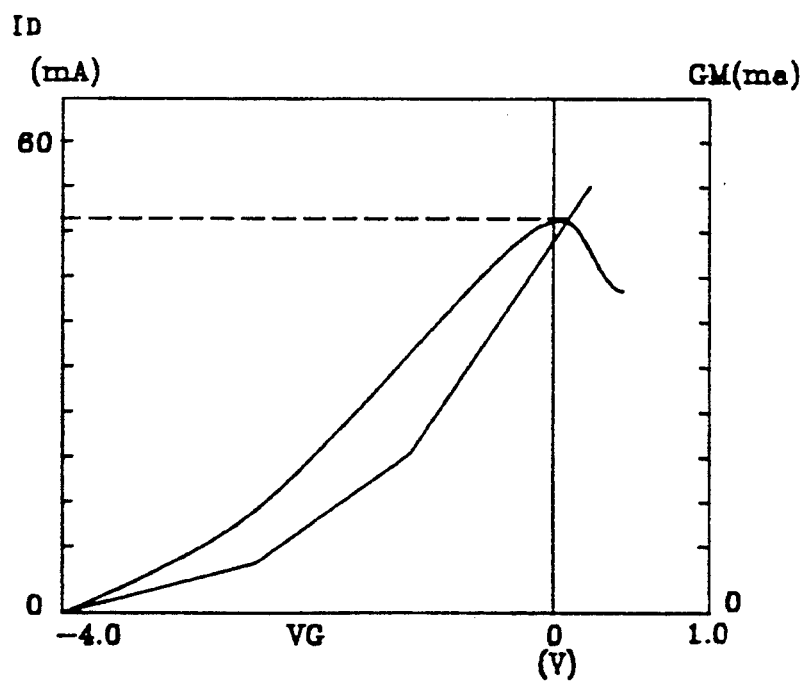
FIG. 5 is a diagram showing a drain current ($I_D$) and transconductance ($g_m$) for a gate voltage according to the present invention.

FIG. 5 shows a transconductance $g_m$ and drain current of the same device for a gate voltage in a 2V drain voltage according to the present invention.

A maximum transconductance of 260 mS/mm is obtained at a drain current of 46 mA, and a gate to drain reverse breakdown voltage of about −6V is obtained. The measured source resistance using the end resistance measurement technique is 0.25 Ωmm. The intrinsic gm was estimated as high as 280 mS/mm by taking Rs into account. The saturation drift velocity $V_s$, by adopting Morkoc's approach, is simply expressed as $$V_s = \frac{\alpha}{W_g \sqrt{2q \ \epsilon_s N_d}} \quad (3)$$

where Wg is the gate width, $\epsilon_s$ is the GaAs permittivity, q is the electron charge, and $N_d$ is the channel doping density, $\alpha$ is the slope of the linear region of the drain saturation current $I_{ds}$ versus the effective bias voltage $V_{eff}$ curve. The effective gate bias voltage $V_{eff}$ is defined as $$V_{eff} = V_{bi} + E_c L_s + R_s I_{ds} - V_g \quad (4)$$

where $V_{bi}$ is the built in voltage, $E_c$ is the critical electron field. For the simple calculation, gate length $L_g$ above has been replaced by the effective channel length, which is the distance between n+ source and drain edges. $R_s$ is a source resistance, and $V_g$ is the gate voltage. Using the method, the high electron saturation velocity of $1.55 \times 10^7$ cm/sec at $V_{ds} = 2V$ is obtained in a channel length of 0.4 μm.

In view of the device structure, the MESFET of the present invention has a transconductance gm independent on the gate length. In other words, the maximum transconductance is just about 260 mS/mm even for the 4 μm gate length device, which value is almost equal to that of 2 μm gate length device.

As a result, owing to the separation of the semiconductor substrate and the channel layer by forming the void below the channel layer, a leakage current and backgating effect are removed. Moreover, as for the effective channel length which is critical for the device characteristic, since it is determined by the void space according to the isolation in formation of the source and the drain regions of the n+-type GaAs layer, it can be greatly minimized in length regardless of the gate length.

On the other hand, it makes no difference even if the gate length is formed a little longer, because the overall resistance for the gate is accordingly reduced.

The source resistance Rs is in the source and the drain region can be minimized by possibly bring the thick n+-type GaAs layer to near the below the gate electrode.

Though the above embodiment adopts the semiconductor substrate with he GaAs having the (100) crystal plate, it may be replaced with (001), (010) crystal plates, furthermore, other compound semiconductor such as InP or GaP can probably be performed.

As above described, in the present invention, the source and the drain regions are formed to have a reverse slope by using the crystal growth characteristic in accordance with the crystal orientation of mask layer on the semi-insulating semiconductor substrate where the insulating layer is formed, thereupon, the channel layer and the gate electrodes are formed to be self-aligned on the upper part of the void formed by the reverse slope of the source and the drain regions, thereby electrically separating the channel and the semiconductor substrate by the void.

Accordingly, the present invention can attain a fast field effect transistor by the reduction of the effective channel length and gate resistance, and the removal of the leakage current, backgating effect without the use of a buffer layer.

The present invention is not limited to the embodiment described hereinabove. Various modifications of disclosed embodiment as well as other embodiments of the present invention will become apparent to persons skilled in the art upon reference to the description of the invention. It is therefore contemplated that the appended claims will cover any such modifications or embodiments as fall within the true scope of the invention.

What is claimed is:

1. A floating channel MESFET comprising:
   a semi-insulating substrate;
   an insulating layer on a portion of a surface of said substrate, said layer having a pair of oppositely disposed sides;
   first and second semiconductor layers disposed in spaced apart relation on said substrate along each of said sides of said insulating layer, said first and second semiconductor layers having side surfaces facing one another across said insulating layer;
   a third semiconductor layer disposed on said side surfaces and including a portion bridging the space between and connected to said first and second semiconductor layers, said bridging portion overlying said insulating layer and being spaced therefrom by an open space;
   a gate electrode formed on said bridging portion; and
   a source electrode contacting said first semiconductor layer and a drain electrode contacting said second semiconductor layer.

2. An MESFET according to claim 1 wherein said side surfaces of said first and second layers overlap respective ones of said sides of said insulating layer.

3. An MESFET according to claim 1 wherein said bridging portion extends onto upper surfaces of said first and second layers, and said gate electrode is disposed on a surface of said bridging portion facing away from said insulating layer.

4. An MESFET according to claim 3 wherein said source and drain electrodes contact said upper surfaces of said first and second layers, respectively, in spaced apart relation with said bridging portion.

5. An MESFET according to claim 1 wherein said semiconductor substrate is made form one of GaAs, InP and GaP.

6. An MESFET according to claim 2 wherein said semiconductor is crystalline and said substrate surface comprises one of the (100), (010) and (001) planes of the semiconductor crystal.

7. An MESFET according to claim 6 wherein said sides of said insulating layer are disposed at an angle of 20°-30° from the $<\bar{1}10>$ direction of said substrate surface.

8. An MESFET according to claim 1 wherein said gate electrode forms a Schottky contact with said bridging and portion.

9. A method of fabricating a floating channel MESFET comprising:
   forming an insulating layer having a pair of opposed sides on a portion of a surface of a semiconductor substrate;
   epitaxially growing, using a selective MOCVD process, a first semiconductor layer on said substrate adjacent to said insulating layer, said first layer growing along both said insulating layer sides to form first and second portions of said first layer along said insulating layer, said first and second layer portions having facing side surfaces separated by a gap which overlies said insulating layer;
   forming a second semiconductor layer covering said side surfaces of said first and second portions and including a link, separated by an open space from said insulating layer, bridging the gap between and connected to said first and second portions; and
   forming a source electrode, a gate electrode and a drain electrode on said first portion, said link, and said second portion, respectively.

10. A method according to claim 9, wherein said substrate is of a crystalline material, said substrate surface comprises one of the planes of the crystalline material, and said insulating layer is formed with said sides thereof disposed at an angle of 20°-30° from the $<\bar{1}10>$ direction of said substrate surface.

11. A method according to claim 9 wherein, as a result of said MOCVD process, said side surfaces are inclined towards one another in a direction upwardly from said substrate, and the upper edges of said side surfaces are spaced apart between 0.5-1.5 um.

* * * * *

UNITED STATES PATENT AND TRADEMARK OFFICE
CERTIFICATE OF CORRECTION

PATENT NO. : 5,274,257
DATED : December 28, 1993
INVENTOR(S) : Chang Tae KIM, et al.

It is certified that error appears in the above-indentified patent and that said Letters Patent is hereby corrected as shown below:

On title page at item 73, after "Suwon" insert -- and Korea Advanced Institute of Science and Technology, Taejonjikal, both of --.

Signed and Sealed this

Twenty-ninth Day of September, 1998

Attest:

BRUCE LEHMAN

*Attesting Officer*     *Commissioner of Patents and Trademarks*